(12) United States Patent
Park

(10) Patent No.: US 8,256,077 B2
(45) Date of Patent: Sep. 4, 2012

(54) METHOD FOR FORMING A CAPACITOR DIELECTRIC HAVING TETRAGONAL PHASE

(75) Inventor: Jong-Bum Park, Ichon-shi (KR)

(73) Assignee: Hynix Semiconductor Inc., Icheon-si (KR)

( * ) Notice: Subject to any disclaimer, the term of this patent is extended or adjusted under 35 U.S.C. 154(b) by 101 days.

(21) Appl. No.: 12/815,338

(22) Filed: Jun. 14, 2010

(65) Prior Publication Data

US 2010/0255217 A1    Oct. 7, 2010

Related U.S. Application Data

(62) Division of application No. 11/617,588, filed on Dec. 28, 2006, now Pat. No. 7,735,206.

(30) Foreign Application Priority Data

Jun. 29, 2006  (KR) .................. 10-2006-0059998

(51) Int. Cl.
H01G 7/00 (2006.01)

(52) U.S. Cl. ........... 29/25.42; 29/25.03; 29/25.41; 361/311; 438/381

(58) Field of Classification Search ...... 29/25.35–25.42; 361/303, 305, 311, 320; 438/240, 287, 761, 438/785; 427/97, 100, 126.5
See application file for complete search history.

(56) References Cited

U.S. PATENT DOCUMENTS

| | | | |
|---|---|---|---|
| 3,582,729 A | 6/1971 | Girard et al. | |
| 5,189,503 A | 2/1993 | Suguro et al. | |
| 5,760,432 A | 6/1998 | Abe et al. | |
| 5,780,115 A * | 7/1998 | Park et al. ............ | 427/539 |
| 6,235,594 B1 | 5/2001 | Merchant et al. | |
| 6,521,930 B2 * | 2/2003 | Ono .................... | 257/295 |
| 6,548,368 B1 | 4/2003 | Narwankar et al. | |
| 6,875,678 B2 | 4/2005 | Jung et al. | |
| 6,989,573 B2 | 1/2006 | Ahn et al. | |
| 7,029,985 B2 * | 4/2006 | Basceri et al. ........ | 438/398 |
| 7,038,284 B2 | 5/2006 | Haukka et al. | |
| 7,094,680 B2 * | 8/2006 | Seutter et al. ........ | 438/618 |
| 7,288,453 B2 | 10/2007 | Jeong et al. | |
| 7,735,206 B2 * | 6/2010 | Park ....................... | 29/25.42 |
| 2005/0196915 A1 | 9/2005 | Jeong et al. | |

FOREIGN PATENT DOCUMENTS

| | | |
|---|---|---|
| JP | 08-273436 | 10/1996 |
| JP | 2006-0096647 | 4/2006 |
| JP | 2006-135339 | 5/2006 |
| KR | 1020040102277 A | 12/2004 |
| KR | 1020050033323 A | 4/2005 |
| KR | 1020050062132 A | 6/2005 |
| KR | 1020060029763 A | 4/2006 |
| WO | WO 2006/028215 A1 | 3/2006 |

* cited by examiner

*Primary Examiner* — Minh Trinh

(74) *Attorney, Agent, or Firm* — Kilpatrick Townsend & Stockton LLP

(57) ABSTRACT

A method for forming a capacitor dielectric includes depositing a tantalum oxide layer over a substrate, performing a post-treatment on the tantalum oxide layer to provide the tantalum oxide layer with a tetragonal phase, and depositing a zirconium oxide layer over the tantalum oxide layer such that the zirconium oxide layer has a tetragonal phase.

12 Claims, 5 Drawing Sheets

METHOD FOR FORMING A CAPACITOR DIELECTRIC HAVING TETRAGONAL PHASE

CROSS-REFERENCE TO RELATED APPLICATIONS

The present invention is a divisional of U.S patent application Ser. No. 11/617,588, filed Dec. 28, 2006, now U.S. Pat. No. 7,735,206, issued on Jun. 15, 2010, which claims priority to Korean patent application number 10-2006-0059998, filed on June 29, 2006 both of which are incorporated herein by reference in their entirety.

BACKGROUND OF THE INVENTION

The present invention relates to a method for manufacturing a semiconductor device; and, more particularly, to a method for forming a capacitor dielectric having a zirconium oxide layer and a tantalum oxide layer, and a method for manufacturing a capacitor using the capacitor dielectric.

A stacked structure of hafnium oxide ($HfO_2$)/aluminum oxide ($Al_2O_3$)/hafnium oxide is conventionally used as a capacitor dielectric in a metal-insulator-metal (MIM) capacitor for enhancing capacitance and minimizing leakage current. Hafnium oxide is a high-dielectric-constant material with a crystalline phase, and aluminum oxide is a low-dielectric-constant material with an amorphous phase.

FIG. 1 is a cross-sectional view of a conventional capacitor structure. The conventional capacitor includes a lower electrode 11, a capacitor dielectric 12 having a stacked structure of $HfO_2$/$Al_2O_3$/$HfO_2$ disposed on the lower electrode 11, and an upper electrode 13 disposed on the capacitor dielectric 12.

Hafnium oxide increases the dielectric constant in the capacitor dielectric 12. However, the leakage current performance characteristic deteriorates when hafnium oxide crystallizes. Thus, the hafnium oxide should be cautiously crystallized in the conventional capacitor structure to achieve a favorable leakage current performance characteristic.

Furthermore, an amount by which the capacitance may be increased may be limited when using hafnium oxide for the capacitor dielectric. Hence, applying hafnium oxide to the capacitor dielectric is difficult when the design rule of the capacitor is reduced.

SUMMARY OF THE INVENTION

Specific embodiments of the present invention provide a method for forming a capacitor dielectric having a zirconium oxide layer and a tantalum oxide layer. Both the zirconium oxide layer and the tantalum oxide layer have a tetragonal phase. The resulting capacitor dielectric maintains a favorable leakage current performance characteristic and a high dielectric constant. A method for manufacturing a capacitor using the disclosed capacitor dielectric is also provided.

In accordance with an aspect of the present invention, a method for forming a capacitor dielectric includes depositing a zirconium oxide layer. A post-treatment is performed on the zirconium layer such that the zirconium oxide layer has a tetragonal phase. A tantalum oxide layer having a tetragonal phase is deposited over the zirconium oxide layer.

In accordance with another aspect of the present invention, a method for forming a capacitor dielectric includes depositing a tantalum oxide layer. A post-treatment is performed on the tantalum oxide layer such that the tantalum oxide layer has a tetragonal phase. A zirconium oxide layer having a tetragonal phase is deposited over the tantalum oxide layer.

In accordance with another aspect of the present invention, a method for manufacturing a capacitor includes forming a lower electrode. A capacitor dielectric is formed over the lower electrode. The capacitor dielectric includes a zirconium oxide layer having a tetragonal phase and a tantalum oxide layer having a tetragonal phase. An upper electrode is formed over the capacitor dielectric.

In accordance with another aspect of the present invention, a capacitor comprises a lower electrode. A capacitor dielectric is formed over the lower electrode, wherein the capacitor dielectric includes a zirconium oxide layer having a tetragonal phase and a tantalum oxide layer having a tetragonal phase. An upper electrode is formed over the capacitor dielectric.

DESCRIPTION OF SPECIFIC EMBODIMENTS

Figure 1:
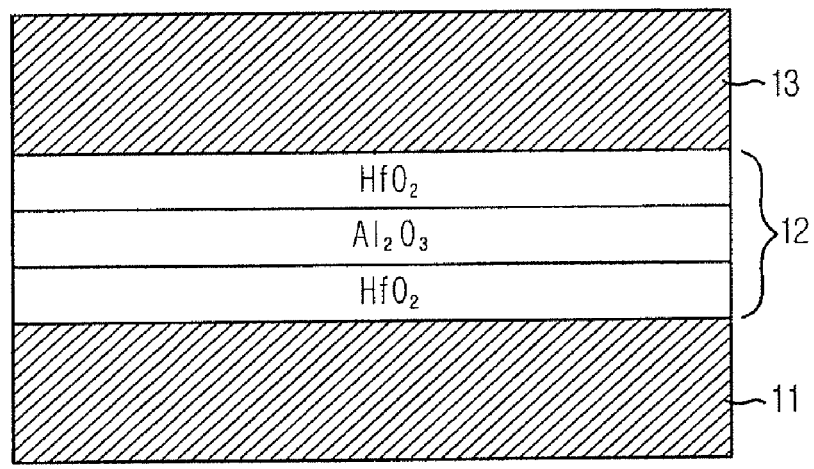
FIG. 1 is a cross-sectional view of a conventional capacitor structure.
Figure 2:
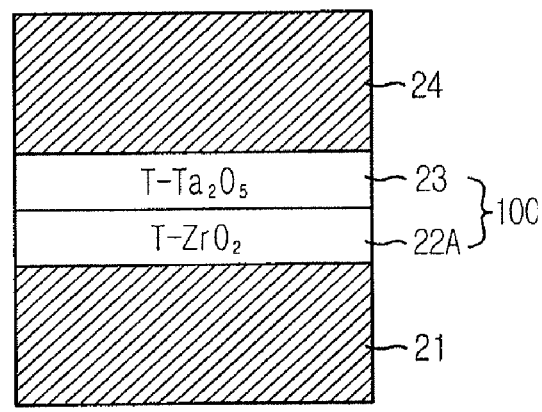
FIG. 2 is a cross-sectional view of a capacitor structure in accordance with a first embodiment of the present invention.

FIG. 2 illustrates a cross-sectional view of a capacitor structure in accordance with a first embodiment of the present invention. A capacitor in accordance with the first embodiment includes a lower electrode 21, a capacitor dielectric 100 disposed on the lower electrode 21, and an upper electrode 24 disposed on the capacitor dielectric 100. The capacitor dielectric 100 includes a zirconium oxide ($ZrO_2$) layer 22A e and a tantalum oxide layer ($Ta_2O_5$) 23. The zirconium oxide layer 22A and the tantalum oxide layer 23 are sequentially stacked on the lower electrode 21.

Figure 3:
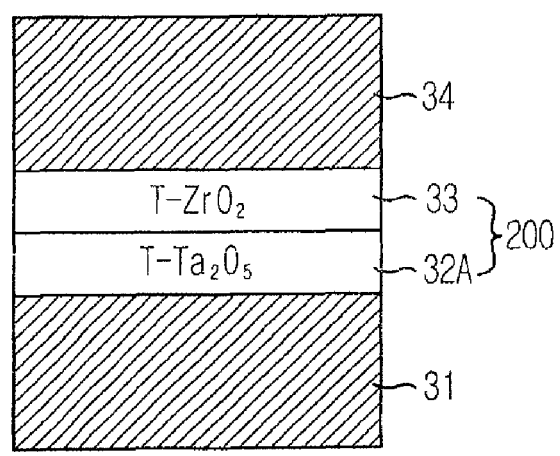
FIG. 3 is a cross-sectional view of a capacitor structure in accordance with a second embodiment of the present invention.

FIG. 3 is a cross-sectional view of a capacitor structure in accordance with a second embodiment of the present invention. A capacitor in accordance with the second embodiment includes a lower electrode 31, a capacitor dielectric 200 disposed on the lower electrode 31, and an upper electrode 34 disposed on the capacitor dielectric 200. The capacitor dielectric 200 is configured with a tantalum oxide layer 32A and a zirconium oxide layer 33. The tantalum oxide layer 32A and the zirconium oxide layer 33 are sequentially stacked on the lower electrode 31.

In FIGS. 2 and 3, both the zirconium oxide layers 22A and 33 and the tantalum oxide layers 23 and 32A that are used for each capacitor dielectric 100 and 200 have a tetragonal phase. Thus, the zirconium oxide layer 22A and 33 and the tantalum oxide layer 23 and 32A are represented as reference symbols T-$ZrO_2$ and T-$Ta_2O_5$, respectively.

An atomic layer deposition process is performed to obtain the tetragonal phase. The tetragonal phase may be obtained using ozone ($O_3$) treatment between two deposition processes for the zirconium oxide and the tantalum oxide layers. A method for forming the capacitor dielectric is described in detail below.

The lower electrodes 21 and 31 and the upper electrodes 24 and 34 each include a metal electrode. Each electrode is formed of one material selected from the group consisting of: titanium nitride (TiN), ruthenium (Ru), platinum (Pt), iridium (Ir) and hafnium nitride (HfN).

Figure 4A:
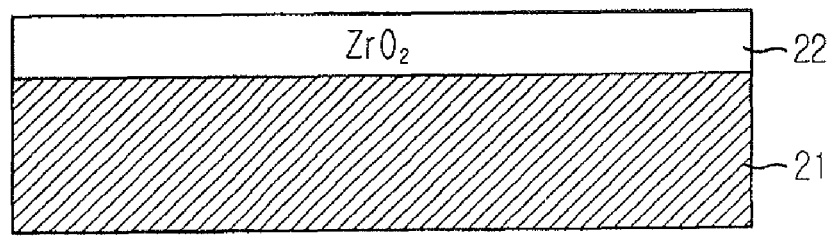
FIGS. 4A to 4C illustrate a method for manufacturing the capacitor according to the first embodiment of the present invention.
Figure 4B:
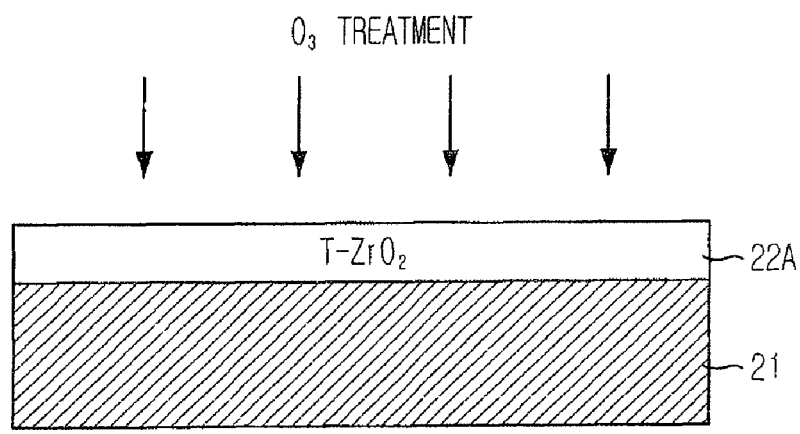
Figure 4C:
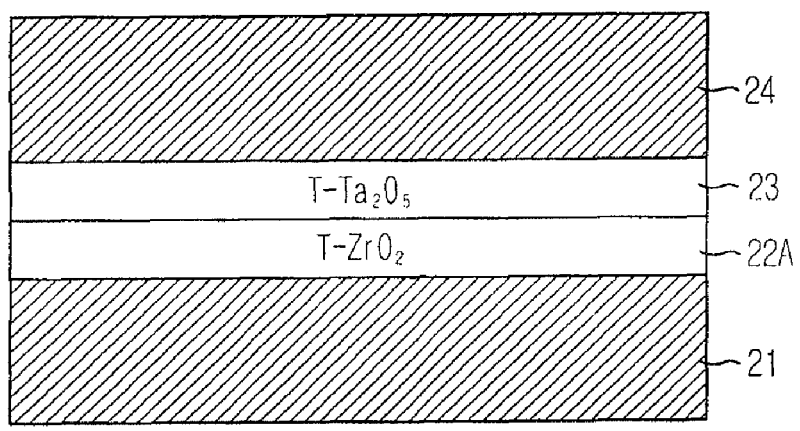

FIGS. 4A to 4C illustrate a method for manufacturing the capacitor according to the first embodiment of the present invention. Referring to FIG. 4A, the lower electrode 21 is formed. The lower electrode 21 includes a metal electrode. Specifically, the lower electrode is formed of one material selected from the group consisting of: TiN, Ru, Pt, Ir and HfN. The surface of the lower electrode 21 is cleaned using fluoric acid or buffered oxide etchant.

A wafer formed with the lower electrode 21 is loaded into a chamber in which an atomic layer deposition process will be performed. The deposition of the zirconium oxide layer 22 is performed under a chamber pressure of approximately 0.1 torr to approximately 10 torr, and at a process temperature of approximately 250 □ to approximately 350 □.

The atomic layer deposition process is performed repeatedly until the zirconium oxide layer 22 has a desired predetermined thickness. Specifically, the atomic layer deposition process is performed by repeating a unit deposition cycle. The unit deposition cycle includes: loading the substrate with the lower electrode 21 into the deposition chamber; introducing a zirconium source; introducing a purge gas; introducing a reactant; and introducing a purge gas again.

After loading the substrate into the deposition chamber, the zirconium source is introduced into the chamber so that it is adsorbed on the lower electrode 21. The zirconium source uses a precursor selected from the group consisting of: $Zr[NC_2H_5CH_3]_4$, $Zr[OC(CH_3)_2CH_2OCH_3]_4$, $Zr[OC(CH_3)_3]_4$, $ZrCl_4$ and $ZrI_4$. The zirconium source flows for approximately 0.1 to 10 seconds.

The purge gas is introduced into the deposition chamber to remove any unreacted zirconium source from the deposition chamber that was not adsorbed on the surface of the lower electrode. Inert gas (e.g., Ar, He, $N_2$ gas or the like, and combinations thereof) is used as the purge gas. The purge gas flows for approximately 0.1 to 10 seconds.

The reactant is introduced into the deposition chamber. The reactant may include $O_3$ or $O_2$ plasma. The reactant flows for approximately 0.1 to 10 seconds.

The purge gas is introduced into the deposition chamber again to remove any unreacted reactant and any by-products. The inert gas is used as the purge gas, and the purge gas flows for approximately 0.1 to 10 seconds.

By repeating the unit deposition cycle described above, the zirconium oxide layer is deposited on the lower electrode 21 at a desired thickness. In one embodiment, the desired thickness is from approximately 40 □ to approximately 100 □. Referring to FIG. 4B, after depositing the zirconium oxide layer 22, an ozone treatment is performed on the zirconium oxide layer 22 so that the zirconium oxide layer 22 has a tetragonal phase. The ozone treatment is performed at a process temperature of approximately 300 □ to approximately 500 □. In addition, the ozone concentration is approximately 180 g/m³ to approximately 300 g/m³. Hereinafter, the zirconium oxide layer 22 with the tetragonal phase is referred to as a T-zirconium oxide layer (T-$ZrO_2$) 22A.

Referring to FIG. 4C, a tantalum oxide layer 23 is deposited on the T-zirconium oxide layer 22A. The tantalum oxide layer 23 has a thickness of approximately 20 □ to approximately 100 □ using the atomic layer deposition process described above. The atomic layer deposition process is performed at a chamber pressure of approximately 0.1 torr to approximately 10 torr, and at a process temperature of approximately 250 □ to approximately 350 □. A deposition method of the tantalum oxide layer 23 is described in detail below.

The atomic layer deposition process is performed repeatedly until the tantalum oxide layer 23 has a desired predetermined thickness. Specifically, the atomic layer deposition process is performed by repeating a unit deposition cycle in a deposition chamber. The unit deposition cycle includes: introducing tantalum source onto the substrate on which the T-zirconium oxide layer 22A is formed; introducing a purge gas; introducing a reactant; and introducing a purge gas again.

The tantalum source is introduced into the deposition chamber to be adsorbed on the T-zirconium oxide layer 22A. The tantalum source uses a precursor of tantalum chloride ($TaCl_5$). The tantalum source flows for approximately 0.1 to 10 seconds.

The purge gas is introduced into the deposition chamber to remove any unreacted remaining tantalum source which is not adsorbed on the surface of the T-zirconium oxide layer 22A. Inert gas (e.g., Ar, He, $N_2$ gas or the like, and combinations thereof) is used as the purge gas. The purge gas flows for approximately 0.1 to 10 seconds.

The reactant is introduced into the deposition chamber. The reactant may include $O_3$ or $O_2$ plasma. The reactant flows for approximately 0.1 to 10 seconds.

The purge gas is introduced into the deposition chamber again to remove any unreacted reactant and by-products. The inert gas is used as the purge gas, and the purge gas flows for approximately 0.1 to 10 seconds.

By repeating the unit deposition cycle described above, the tantalum oxide layer 23 is deposited on the T-zirconium oxide layer 22A at a desired thickness. In one embodiment, the desired thickness is from approximately 20 □ to approximately 100 □.

When the tantalum oxide layer 23 is deposited as described above, the tantalum oxide layer 23 has a tetragonal phase. In other words, when the tantalum oxide layer 23 is deposited on the T-zirconium oxide layer 22A having the tetragonal phase, the tantalum oxide layer 23 also has the tetragonal phase. Hereinafter, the tantalum oxide layer 23 with the tetragonal phase is referred to as a T-tantalum oxide layer (T-$Ta_2O_5$).

Figure 5A:
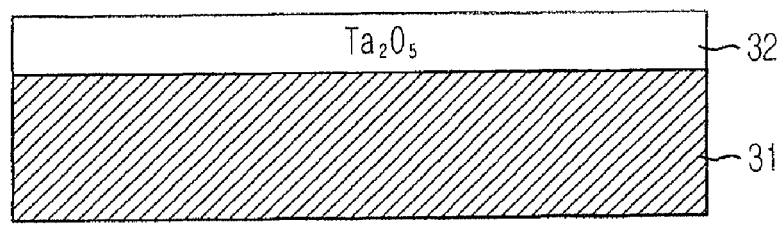
FIGS. 5A to 5C illustrate a method for manufacturing the capacitor according to the second embodiment of the present invention.
Figure 5B:
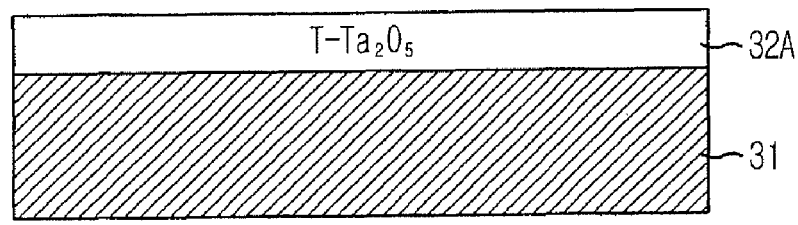
Figure 5C:
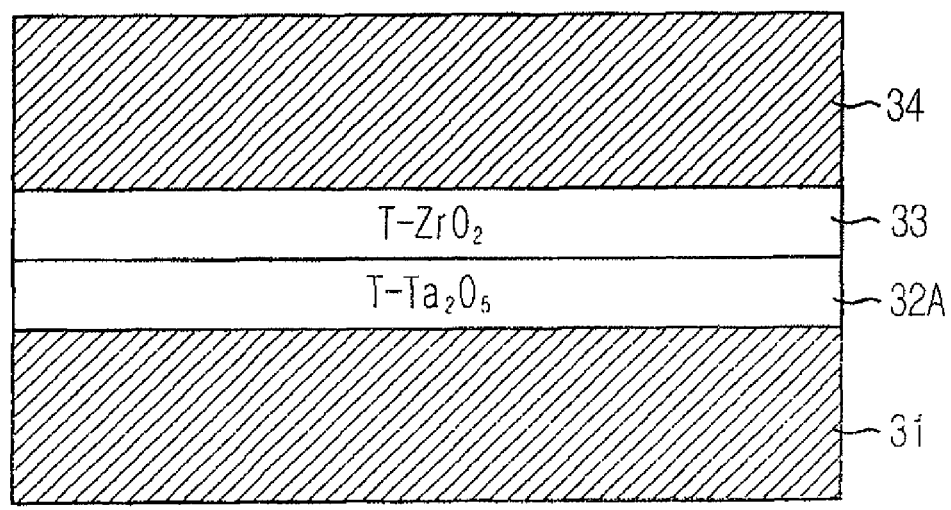

FIGS. 5A to 5C illustrate a method for manufacturing a capacitor according to the second embodiment of the present invention. Referring to FIG. 5A, the lower electrode 31 is formed. In one embodiment, the lower electrode 31 includes a metal. Specifically, the lower electrode 31 is formed of one material selected from the group consisting of: TiN, Ru, Pt, Ir and HfN. The surface of the lower electrode 31 is cleaned using fluoric acid or buffered oxide etchant.

A wafer that is formed with the lower electrode 31 is loaded into a chamber in which an atomic layer deposition process will be performed. The deposition of the tantalum oxide layer 32 is performed at a chamber pressure of approximately 0.1 torr to approximately 10 torr, and at a process temperature of approximately 250 □ to approximately 350 □.

The tantalum oxide layer 32 is deposited on the lower electrode 31 at a thickness of approximately 20 □ to approximately 100 □ using the atomic layer deposition process. The atomic layer deposition process is performed under a chamber pressure of approximately 0.1 torr to approximately 10 torr and at a process temperature of approximately 250 □ to approximately 350 □. A deposition method of the tantalum oxide layer 32 is described in detail below.

The atomic layer deposition process is performed repeatedly until the tantalum oxide layer 32 has a desired predetermined thickness. Specifically, the atomic layer deposition process is performed by repeating a unit deposition cycle. The unit deposition cycle includes: introducing a tantalum source into the deposition chamber; introducing a purge gas; introducing a reactant; and introducing a purge gas again.

The tantalum source is introduced into the deposition chamber so that the tantalum source is adsorbed on the lower electrode 31. In one embodiment, the tantalum source uses a precursor of tantalum chloride ($TaCl_5$). The tantalum source flows for approximately 0.1 to 10 seconds.

The purge gas is introduced into the deposition chamber to remove any unreacted remaining tantalum source. The unreacted tantalum source may include tantalum source that is not adsorbed on the surface of the lower electrode 31. Inert gas (e.g., Ar, He, $N_2$ gas, or the like, and combinations thereof) is used as the purge gas. The purge gas flows for approximately 0.1 to 10 seconds.

The reactant is introduced into the deposition chamber. The reactant may include $O_3$ or $O_2$ plasma. The reactant flows for approximately 0.1 to 10 seconds.

The purge gas is introduced into the deposition chamber again to remove any unreacted reactant and by-products. The inert gas is used as the purge gas, and the purge gas flows for approximately 0.1 to 10 second(s).

By repeating the unit deposition cycle, the tantalum oxide layer 32 is deposited on the lower electrode 31 at a desired thickness. In one embodiment, the desired thickness of the tantalum oxide layer 32 is from approximately 20 □ to approximately 100 □.

After depositing the tantalum oxide layer 32, ozone treatment is performed to provide the tantalum oxide layer 32 with a tetragonal phase, as illustrated in FIG. 5B. In one embodiment, the ozone treatment is performed at a process temperature of approximately 300 □ to approximately 500 □, and at an ozone concentration of approximately 180 g/m³ to approximately 300 g/m³. The tantalum oxide layer 32 is converted into the tantalum oxide with the tetragonal phase (T-$Ta_2O_5$) after the ozone treatment.

Subsequently, referring to FIG. 5C, a zirconium oxide layer 33 is deposited on the T-tantalum oxide layer 32A.

A deposition method of the zirconium oxide layer using the atomic layer deposition process will be described. The atomic layer deposition process is performed repeatedly until the zirconium oxide layer has a desired predetermined thickness. Specifically, the atomic layer deposition process is performed by repeating a unit deposition cycle. The unit deposition process includes: loading the substrate formed with the T-tantalum oxide layer 32A into the deposition chamber; introducing a zirconium source; introducing a purge gas; introducing a reactant; and introducing a purge gas again.

After loading the substrate into the deposition chamber, the zirconium source is introduced into the chamber so that it is adsorbed on the T-tantalum oxide layer 32A. In one embodiment, the zirconium source uses a precursor selected from the group consisting of: $Zr[NC_2H_5CH_3]_4]$, $Zr[OC(CH_3)_2CH_2OCH_3]_4$, $Zr[OC(CH_3)_3]_4$, $ZrCl_4$ and $ZrI_4$. The zirconium source flows for approximately 0.1 to 10 seconds.

The purge gas is introduced into the deposition chamber to remove any unreacted remaining zirconium source from the deposition chamber. The unreacted zirconium source may include any zirconium source that is not adsorbed on the surface of the T-tantalum oxide layer 32A. Inert gas (e.g., Ar, He, $N_2$ gas or the like, and combinations thereof) is used as the purge gas. The purge gas flows for approximately 0.1 to 10 seconds.

The reactant is introduced into the deposition chamber. The reactant may include $O_3$ or $O_2$ plasma. The reactant flows for approximately 0.1 to 10 seconds.

The purge gas is introduced into the deposition chamber again to remove any unreacted reactant and by-products. The inert gas is used as the purge gas, and the purge gas flows for approximately 0.1 to 10 seconds.

By repeating the unit deposition cycle, the zirconium oxide layer 33 is deposited on the T-tantalum oxide layer 32A at a desired thickness. In one embodiment, the desired thickness of the zirconium oxide layer 33 is from approximately 40 □ to approximately 100 □.

When the zirconium oxide layer 33 is deposited as described above, the zirconium oxide layer 33 has a tetragonal phase. In other words, when the zirconium oxide layer 33 is deposited on the T-tantalum oxide layer 32A having the tetragonal phase, the zirconium oxide layer 33 also has the tetragonal phase.

In the embodiments described, the deposition of the zirconium oxide layer, the ozone treatment and the deposition of the tantalum oxide layer are performed in situ.

In accordance with the embodiments described above, the capacitor dielectric is configured as a bilayer with $Ta_2O_5/ZrO_2$ or $ZrO_2/Ta_2O_5$, instead of a multi-stacked layer such as a conventional triple layer with $HfO_2/Al_2O_3/HfO_2$. In the present embodiments, a first dielectric layer, i.e., the zirconium oxide layer (or tantalum oxide layer), is deposited with a predetermined thickness. The ozone treatment is performed to provide the first dielectric layer with the tetragonal phase. Subsequently, a second dielectric layer, i.e., the tantalum oxide layer (or zirconium oxide layer), is deposited on the ozone-treated first dielectric layer such that the second dielectric layer also has the tetragonal phase. In other words, by depositing the second dielectric layer on the ozone-treated first dielectric layer with the tetragonal phase at a predetermined temperature, the second dielectric layer is deposited with the tetragonal phase on the first dielectric layer. For example, if the tantalum oxide layer is deposited on the T-zirconium oxide layer, the tantalum oxide layer formed on the T-zirconium oxide layer also has the tetragonal phase.

When both the zirconium oxide layer and the tantalum oxide layer have the tetragonal phase, they provide better leakage current performance characteristic than the zirconium oxide and the tantalum oxide layers at other phases.

The dielectric constant of the zirconium oxide layer is nearly two times greater in the tetragonal phase than in a cubic phase. Specifically, the zirconium oxide layer has a dielectric constant of approximately 23 in the cubic phase, but it has a dielectric constant of approximately 40 in the tetragonal phase. Thus, the leakage current performance characteristic is enhanced.

Furthermore, it is possible to obtain a higher capacitance than the conventional capacitor dielectric. Similarly, the tantalum oxide layer has a dielectric constant of approximately 20 in the amorphous phase, whereas it has a dielectric constant of approximately 25 to approximately 50 during crystallization. Therefore, the capacitance of the tantalum oxide layer is improved.

When forming the capacitor dielectric by sequentially performing the deposition of the first dielectric layer, the ozone treatment, and the deposition of the second dielectric layer, the capacitor dielectric having the tetragonal phase can be formed by controlling the process temperature and the deposition thickness of each dielectric layer. Thus, it is possible to form a capacitor dielectric that can provide high capacitance as well as excellent leakage current performance characteristics.

As described above, in accordance with the present invention, the stacked structure of the zirconium oxide layer and the tantalum oxide layer is used as the capacitor dielectric.

The ozone treatment is performed between two deposition processes so that both the zirconium oxide layer and the tantalum oxide layer have the tetragonal phase. The tetragonal phase enhances the leakage current performance characteristics and increases the capacitance.

In one embodiment, the stacked structure of the zirconium oxide layer and the tantalum oxide layer has an effective oxide thickness of approximately 9 □ or smaller due to a high dielectric constant. Accordingly, it is possible to secure sufficient capacitance even though a design rule is reduced While the present invention has been described with respect to specific embodiments, it will be apparent to those skilled in the art that various changes and modifications may be made without departing from the spirit and scope of the invention as defined in the following claims.

What is claimed is:

1. A method for forming a capacitor dielectric, the method comprising:
   depositing a tantalum oxide layer over a substrate;
   performing a post-treatment on the tantalum oxide layer to provide the tantalum oxide layer with a tetragonal phase; and
   depositing a zirconium oxide layer over the tantalum oxide layer such that the zirconium oxide layer has a tetragonal phase,
   wherein depositing the tantalum oxide layer and depositing the zirconium oxide layer are performed using an atomic layer deposition process,
   wherein the atomic layer deposition process of the zirconium oxide layer is performed by repeating a first unit deposition cycle until the zirconium oxide layer has a thickness of approximately 40 Å to approximately 100 Å, the first unit deposition cycle comprising introducing a zirconium source, introducing a first purge gas, introducing a first reactant, and introducing a second purge gas.

2. The method of claim 1, wherein the post-treatment involves a use of ozone.

3. The method of claim 2, wherein the post-treatment is performed at a temperature of approximately 300° C. to approximately 500° C. in an environment with an oxygen concentration of approximately 180 g/m$^3$ to approximately 300 g/m$^3$.

4. The method of claim 1, wherein the zirconium source uses a precursor selected from a group consisting of: $Zr[NC_2H_5CH_3]_4$, $Zr[OC(CH_3)_2CH_2OCH_3]_4$, $Zr[OC(CH_3)_3]_4$, $ZrCl_4$ and $ZrI_4$, and further wherein the zirconium source flows for approximately 0.1 to 10 seconds.

5. The method of claim 1, wherein the atomic layer deposition process of the tantalum oxide layer is performed by repeating a second unit deposition cycle until the tantalum oxide layer has a thickness of approximately 20 Å to approximately 100 Å, the second unit deposition cycle comprising: introducing a tantalum source, introducing a third purge gas, introducing a second reactant, and introducing a fourth purge gas.

6. The method of claim 5, wherein the tantalum source uses a precursor of tantalum chloride, and further wherein the tantalum source flows for approximately 0.1 to 10 seconds.

7. The method of claim 5, wherein the second reactant includes one of: $O_3$ and $O_2$ plasma.

8. The method of claim 5, wherein the third purge gas and the fourth purge gas each includes an inert gas.

9. The method of claim 5, wherein depositing the tantalum oxide layer and depositing the zirconium oxide layer are performed at a temperature of approximately 250° C. to approximately 350° C. and under a pressure of approximately 0.1 torr to approximately 10 torr.

10. The method of claim 1, wherein the depositing-a-tantalum-oxide-layer step, the performing-a-post-treatment step, and the depositing-a-zirconium-oxide-layer step are performed in situ.

11. The method of claim 1, wherein the first reactant includes one of: $O_3$ and $O_2$ plasma.

12. The method of claim 1, wherein the first purge gas and the second purge gas each include an inert gas.

* * * * *